(12) United States Patent
Sugii et al.

(10) Patent No.: US 7,579,229 B2
(45) Date of Patent: Aug. 25, 2009

(54) SEMICONDUCTOR DEVICE AND SEMICONDUCTOR SUBSTRATE

(75) Inventors: Nobuyuki Sugii, Tokyo (JP); Kiyokazu Nakagawa, Sayama (JP); Shinya Yamaguchi, Mitaka (JP); Masanobu Miyao, Fukuoka (JP)

(73) Assignee: Renesas Technology Corp., Tokyo (JP)

( * ) Notice: Subject to any disclaimer, the term of this patent is extended or adjusted under 35 U.S.C. 154(b) by 72 days.

(21) Appl. No.: 12/010,123

(22) Filed: Jan. 22, 2008

(65) Prior Publication Data
US 2008/0206961 A1 Aug. 28, 2008

Related U.S. Application Data

(63) Continuation of application No. 10/920,432, filed on Aug. 18, 2004, now abandoned, which is a continuation of application No. 09/536,446, filed on Mar. 28, 2000, now abandoned.

(30) Foreign Application Priority Data

Mar. 30, 1999 (JP) .................... 11-087831

(51) Int. Cl.
*H01L 21/762* (2006.01)
(52) U.S. Cl. .................... 438/199; 438/455; 257/19; 257/E21.567
(58) Field of Classification Search .......... 438/199, 438/483; 257/19, 191, E21.567
See application file for complete search history.

(56) References Cited

U.S. PATENT DOCUMENTS

| 4,878,957 | A | 11/1989 | Yamaguchi et al. |
| 5,013,681 | A | 5/1991 | Godbey et al. |
| 5,384,473 | A | 1/1995 | Yoshikawa et al. |
| 5,698,869 | A | 12/1997 | Yoshimi et al. |
| 5,891,769 | A | 4/1999 | Liaw et al. |
| 6,059,895 | A * | 5/2000 | Chu et al. .................. 148/33.1 |
| 6,326,279 | B1 * | 12/2001 | Kakizaki et al. ............ 438/406 |

(Continued)

FOREIGN PATENT DOCUMENTS

EP 0 449 620 10/1991

(Continued)

OTHER PUBLICATIONS

M. V. Fischetti et al, "Band Structure, Deformation Potentials, and Carrier Mobility in Strained Si, Ge, and SiGe Alloys", J. Appl. Phys., vol. 80, Aug. 15, 1996, pp. 2234-2252.

(Continued)

*Primary Examiner*—Kenneth A Parker
*Assistant Examiner*—Jose R Diaz
(74) *Attorney, Agent, or Firm*—Mattingly & Malur, P.C.

(57) ABSTRACT

In order to provide a semiconductor device having a field effect transistor with a low power consumption and a high speed by use of the combination of Si and an element such as Ge, C or the like of the same group as Si, a strain is applied by a strain applying semiconductor layer 2 to a channel forming layer 1 having a channel of the field effect transistor formed therein so that the mobility of carriers in the channel is made larger than the mobility of carriers in that material of the channel forming layer which is unstrained.

7 Claims, 9 Drawing Sheets

U.S. PATENT DOCUMENTS

| | | |
|---|---|---|
| 6,682,965 B1 | 1/2004 | Noguchi et al. |
| 6,689,211 B1 * | 2/2004 | Wu et al. ................ 117/94 |
| 2002/0030227 A1 * | 3/2002 | Bulsara et al. ............. 257/346 |

FOREIGN PATENT DOCUMENTS

| | | |
|---|---|---|
| EP | 0 587 520 | 3/1994 |
| JP | 53-76769 | 7/1978 |
| JP | 3-187269 | 8/1991 |
| JP | 6-177375 | 6/1994 |
| JP | 9-82944 | 3/1997 |
| JP | 9-321307 | 12/1997 |
| JP | 10-270685 | 10/1998 |
| JP | 10-308513 | 11/1998 |
| JP | 2000-277715 | 10/2000 |

OTHER PUBLICATIONS

Rim, Kern et al, "Transconductance Enhancement in Deep Submicron Strained-Si n-MOSFETs", IEEE IEDM 98-707, 1998, pp. 26.8.1-26.8.4.

* cited by examiner

SEMICONDUCTOR DEVICE AND SEMICONDUCTOR SUBSTRATE

This is a continuation application of U.S. Ser. No. 10/920,432, filed Aug. 18, 2004, now abandoned which is a continuation application of U.S. Ser. No. 09/536,446, filed Mar. 28, 2000 (now abandoned), both of which are incorporated by reference.

BACKGROUND OF THE INVENTION

The present invention relates to a semiconductor device and a method for manufacture thereof, and more particularly to a semiconductor device including an field effect transistor.

In an integrated circuit using SiMOS field effect transistors (Si-MOSFET's), the coexistence of the reduction in power consumption and the enhancement in speed has been attained by making the reduction in device dimension, the reduction in operating voltage and so forth in accordance with a so-called scaling rule.

However, there have arisen many problems including the problem of a short-channel effect generated in association with the reduction in dimension and the problem of that deterioration of an operation margin caused by the closeness of a drain voltage and a threshold voltage to each other which becomes remarkable in the case where the reduction in voltage is contemplated.

Also, when eyes are turned to the mobility which makes a barometer for the enhancement in speed, the various improvements as mentioned above are ironically enough caught in the result that the mobility in Si in the real device is smaller than 100 or is far less than the value of mobility in bulk.

Thus, a further improvement of the performance of the conventional Si-MOSFET has become very difficult.

SUMMARY OF THE INVENTION

The further improvement in performance has a need to contemplate the enhancement in speed by improving a semiconductor material itself. One solution is to use a so-called compound semiconductor which provides a high speed in itself. However, this solution is not realistic since it is very difficult to combine the compound semiconductor technology with the Si integrated circuit technology and the manufacture cost becomes stupendous.

One object of the present invention is to provide a semiconductor device having a field effect transistor with a low power consumption and a high speed by use of the combination of Si and an element such as Ge, C or the like in the same group as that of Si.

According to one aspect of the present invention, a strain applying semiconductor layer applies a strain to a channel forming layer in which a channel of a field effect transistor is formed. Thereby, the mobility of carriers in the channel is made larger than the mobility of carriers in that material of the channel forming layer which is unstrained. For example, in the case where the material of the channel forming layer is Si, the strain application makes the in-plane lattice constant of the Si channel forming layer larger than that of unstrained Si.

It has been suggested that the mobility of carriers in Si or Ge applied with a strain may be increased as compared with that in unstrained Si or Ge (M. V. Fischetti and S. E. Laux: J. Appl. Phys. 80(4), 15 Aug. 1996, pp. 2234-2252). This is known for long or has the same origin as that of a phenomenon that the deposition of Si on sapphire causes an increase in mobility since Si is subjected to an in-plane strain. In the one aspect of the present invention, this phenomenon is put into practice to fabricate a field effect transistor and a semiconductor device such as an integrated circuit using the field effect transistor.

According to another aspect of the present invention, there is provided a semiconductor device having a p-type field effect transistor in which the energy at a top of the valence band of the interface between a channel forming layer and one of layers adjacent to opposite surfaces of the channel forming layer lying on a gate insulating film side of the channel forming layer is made larger than that of the interface between the channel forming layer and the other adjoining layer lying on the other side of the channel forming layer.

According to another aspect of the present invention, there is provided a semiconductor device having an n-type field effect transistor in which the energy at a top of the conduction band of the interface between a channel forming layer and one of layers adjacent to opposite surfaces of the channel forming layer lying on a gate insulating film side of the channel forming layer is made smaller than that of the interface between the channel forming layer and the other adjoining layer lying on the other side of the channel forming layer.

According to another aspect of the present invention, there is provided a structure in which an energy barrier for carriers in a channel of a field effect transistor exists on a side of the channel opposite to a gate insulating film, and the lattice of a channel forming layer having the channel formed therein is strained so that the mobility of carriers in the channel is made larger than the mobility of carriers in that material of the channel forming layer which is unstrained.

DETAILED DESCRIPTION OF THE EMBODIMENTS

Figure 1:
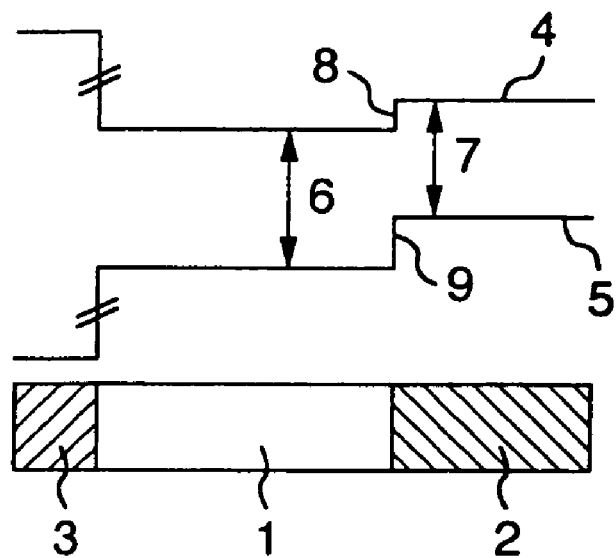
FIG. 1 is a diagram for explaining the principle of operation of the present invention or a band diagram of the multilayered structure of an $SiO_2$ gate insulating film, a strained Si layer and an $Si_{1-x}Ge_x$ strain applying layer.

First, the description will be made of the band structure of and the principle of operation of a field effect transistor having a channel of Si subjected to a strain. It is suitable to use $Si_{1-x}Ge_x$ (0<x<1) for a strain applying layer which applies the strain to Si. FIG. 1 shows a band diagram of the multilayered structure of an $SiO_2$ gate insulating film 3, a strained Si layer 1 and an $Si_{1-x}Ge_x$ strain applying layer 2. The band diagram exhibits a band discontinuity the type of which is such that the band gap 6 of the strained Si layer 1 is wider than the band gap 7 of the $Si_{1-x}Ge_x$ strain applying layer 2 and the energies of the valence band 5 and the conduction band 4 of the strained Si layer 1 are both lowered.

Figure 2:
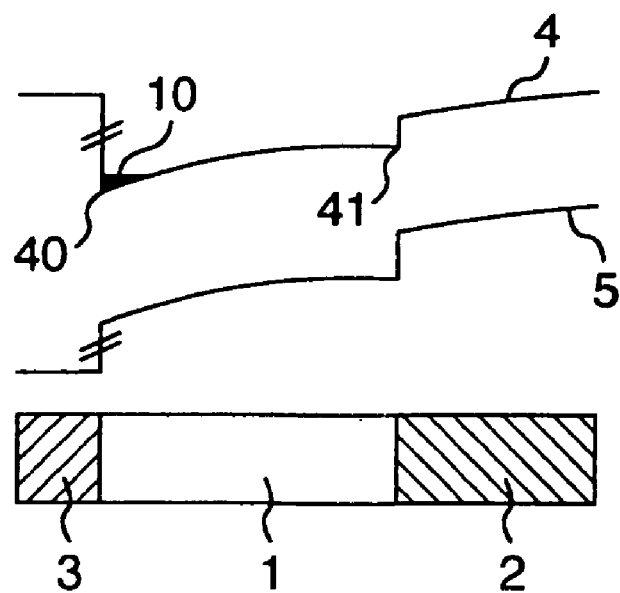
FIG. 2 is a band diagram in a state in which a positive bias is applied to a gate of the structure shown in FIG. 1.

Now, in the case of an n-type field effect transistor, the application of a positive voltage to the gate causes a band bend in the vicinity of the interface between the gate insulating film 3 and the strained Si layer 1, as shown in FIG. 2, so that electrons are stored in a notch 10 of the conduction band in the strained Si layer 1 formed in the bent portion, thereby enabling a transistor operation. This is quite the same as an ordinary MOS type field effect transistor.

Figure 3:
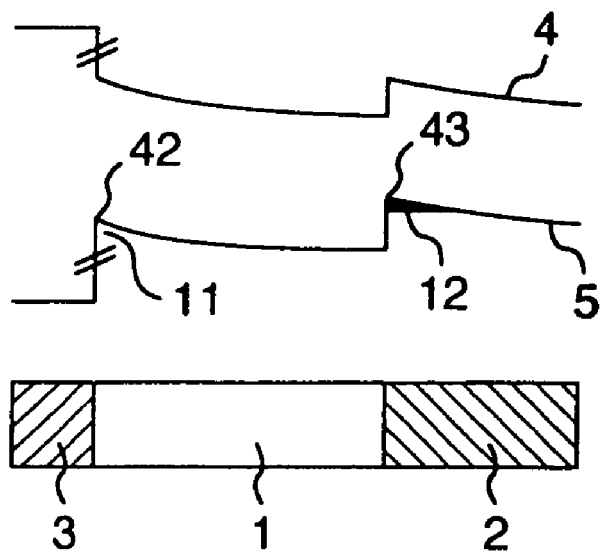
FIG. 3 is a band diagram in a state in which a negative bias is applied to the gate of the structure shown in FIG. 1.

In the case of a p-type field effect transistor, the application of a negative voltage to the gate causes a band bend in the vicinity of the interface between the gate insulating film 3 and the strained Si layer 1, as shown in FIG. 3. However, more holes are stored in a notch 12 of the valence band in the $Si_{1-x}Ge_x$ strain applying layer 2 formed in the interface between the strained Si layer 1 and the $Si_{1-x}Ge_x$ strain applying layer 2 than a notch 11 of the valence band in the strained Si layer 1 formed in the bent portion. But, since the mobility of holes in the $Si_{1-x}Ge_x$ strain applying layer 2 is remarkably small as compared with that in the strained Si layer 1, there is a problem that the enhancement in speed cannot be contemplated as compared with an ordinary MOS type field effect transistor. Also, there is a problem that in the case where complementary field effect transistors are formed, it becomes difficult to balance p and n channels with each other.

The above problems can be solved by reducing the accumulation of holes in the notch 12 through the following methods. In a first method, the source/drain junction depth is made sufficiently shallower than the thickness of the strained Si layer 1, thereby preventing the effluence of holes into the $Si_{1-x}Ge_x$ strain applying layer 2. More particularly, for example, when the thickness of the strained Si layer 1 is 70 nm, the junction depth may be selected to be about 40 nm. Since this is much the same as a value used in a short-channel device having a channel length shorter than 0.1 microns, it is sufficiently realizable.

Figure 4:
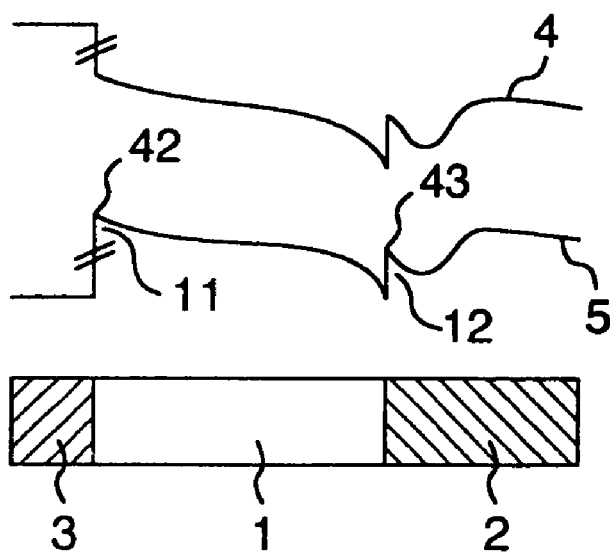
FIG. 4 is a band diagram in a state in which a steep n-type doping is applied to the uppermost portion of the $Si_{1-x}Ge_x$ strain applying layer of the structure shown in FIG. 1.

In a second method, a steep n-type doping, preferably, with the doping depth in the range of 0.1 to 30 nm is applied in the vicinity of the interface between the $Si_{1-x}Ge_x$ strain applying layer 2 and the strained Si layer 1. With this method, the energy level at the top 43 of the notch 12 of the valence band in the $Si_{1-x}Ge_x$ strain applying layer 2 is lowered, as shown in FIG. 4. For example, it becomes lower than the energy level at the top 42 of the notch 11 of the valence band in the strained Si layer 1. As a result, the storage of holes in the notch 12 is reduced. This method can also be realized by applying the n-type doping to the strained Si layer 1 or both the strained Si layer and the $Si_{1-x}Ge_x$ strain applying layer 2. In this case too, it is preferable that the doping depth is in the range of 0.1 to 30 nm.

Figure 5:
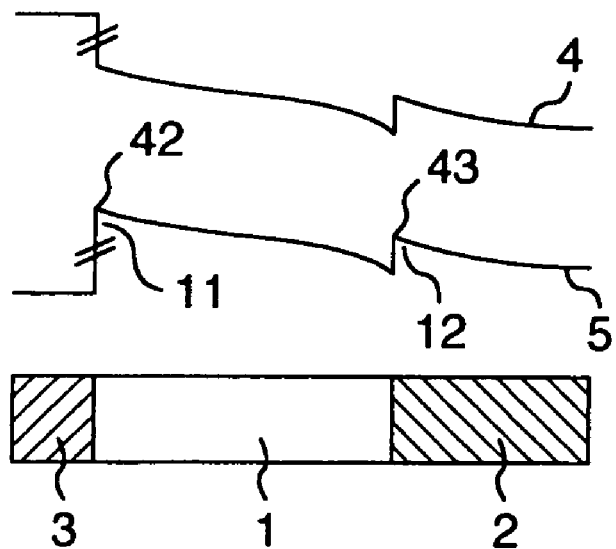
FIG. 5 is a band diagram in a state in which a substrate biasing voltage is applied to the structure shown in FIG. 1.

In a third method, a substrate biasing voltage is controlled so that a positive voltage is applied onto the $Si_{1-x}Ge_x$ strain applying layer 2 side. As shown in FIG. 5, this method provides a band structure with a downward inclination on the right side, that is, a falling on the $Si_{1-x}Ge_x$ strain applying layer 2 side so that the energy level at the top 43 of the notch 12 of the valence band in he $Si_{1-x}Ge_x$ strain applying layer 2 becomes lower than the energy level at the top 42 of the notch 11 of the valence band in the strained Si layer 1. As a result, the storage of holes in the notch 12 is reduced.

As mentioned in the above, the prevention of the effluence of holes from the strained Si channel into the strain applying layer is a factor indispensable to the realization of a p-type field effect transistor or complementary field effect transistors. Further, in order to contemplate the enhancement in speed and the reduction in voltage, the employment of the following construction is also effective. Namely, the material of a drain region in the case of a p-type field effect transistor or a source region in the case of an n-type field effect transistor is selected to be the same parent material as the $Si_{1-x}Ge_x$ strain applying layer or to have the same composition ratio as the $Si_{1-x}G_x$ strain applying layer. With such a construction, a band discontinuity between the strained Si and the SiGe causes a change in electric field distribution between the source and the drain to enable the more effective acceleration of carriers. Thereby, a further enhancement in speed can be contemplated and the reduction in pinch off voltage enables an operation at a low voltage.

The description up to here has been made in conjunction with a transistor using strained Si as a channel for either electrons or holes. In connection with holes, however, when strained $Si_{1-y}Ge_y$ (0<y≦1) is used as a channel, there is realized the further increase in mobility, that is, the further enhancement in speed. In the case where $Si_{1-x}Ge_x$ is used for a strain applying layer, Si formed as an overlying layer on $Si_{1-x}Ge_x$ is applied with an in-plane tensile strain while $Si_{1-y}Ge_y$ formed as an overlying layer on $Si_{1-x}Ge_x$ is applied with an in-plane compressive strain.

Figure 6:
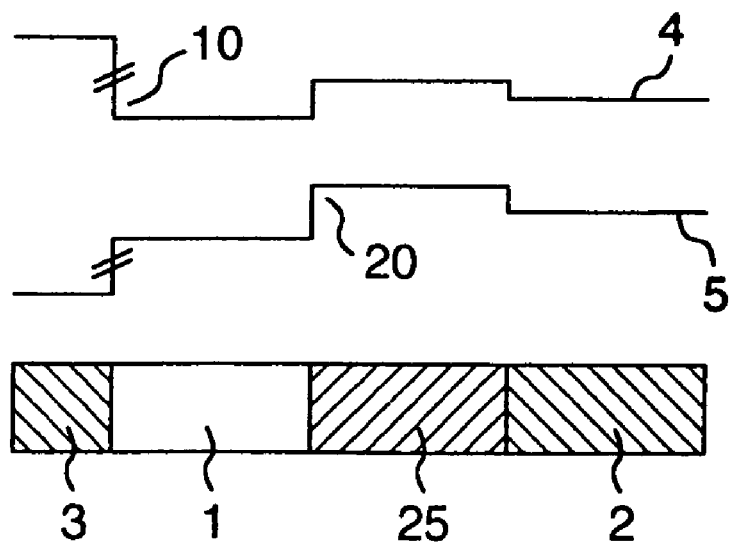
FIG. 6 is another diagram for explaining the principle of operation of the present invention or a band diagram of the multilayered structure of an $SiO_2$ gate insulating film, a strained Si layer, a strained $Si_{1-y}Ge_y$ layer and an $Si_{1-x}Ge_x$ strain applying layer.

In the case where a strained $Si_{1-y}Ge_y$ layer 25, a strain Si layer 1 and a gate insulating film 3 are formed in the mentioned order on an $Si_{1-x}Ge_x$ strain applying layer 2 so that they overlie each other, there results in a band diagram, as shown in FIG. 6, in which electrons are stored in the notch 10 of the conduction band in the strained Si layer 1 in the vicinity of the interface between the strained Si layer 1 and the gate insulating film 3 and holes are stored in the notch 20 of the valence band in the strained $Si_{1-y}Ge_y$ layer 25 in the vicinity of the interface between the strained Si layer 1 and the strained $Si_{1-y}Ge_y$ layer 25. Unlike the case where the strained Si layer 1 is used as a channel for holes, the effluence of holes into the strain applying layer 2 becomes hard to generate. Whichever of the strained Si layer 1 and the strained $Si_{1-y}Ge_y$ layer 25 overlies the other, it is possible to operation the resultant structure as a device. However, since the mobility of holes in the strained $Si_{1-y}Ge_y$ layer 25 is higher than the mobility of electrons in the strained Si layer 1, a construction having the strained $Si_{1-y}Ge_y$ layer 25 far from the gate electrode or overlaid by the strained Si layer 1 is more preferable considering a balance in mutual conductance in the case where complementary field effect transistors are formed.

Also, an additional SiGe layer may be sandwiched between the strained Si layer 1 or the strained $Si_{1-y}Ge_y$ layer 25 and the gate insulating film 3. In this case, since electrons or holes are confined in the strained Si layer 1 or the strained $Si_{1-y}Ge_y$ layer 25 in the vicinity of the interface thereof with the additional SiGe layer, they are free of the influences of the interface state with respect to the gate insulating film 3 and the scattering thereat.

Also, instead of the construction in which the strained Si layer and the strained $Si_{1-y}Ge_y$ layer are formed overlying each other, they may be grown by use of a selective growth method so that the strained $Si_{1-y}Ge_y$ layer is grown in a p-channel area while the strained Si layer is grown in an n-channel area.

It is preferable that Si1-xGex is used for the strain applying layer. The lattice constant of Ge is larger than that of Si by about 4%. The lattice constant of $Si_{1-x}Ge_x$ takes an interpolated value in accordance with the Ge composition ratio. Accordingly, if a proper value of x is selected, it is possible to apply a desired strain to Si or Ge overlying $Si_{1-x}Ge_x$. For example, if x is selected to be 0.5, it is possible to apply an in-plane tensile strain of 2% and an in-plane compressive strain of 2% to Si and Ge, respectively. The magnitude of the strain of each of Si and $Si_{1-y}Ge_y$ can be controlled in accordance with the selected value of x. Namely, the in-plane lattice constant of a strained Si layer can be made larger than that of unstrained Si within a range of proportions less than 4% and the in-plane lattice constant of a strained $Si_{1-y}Ge_y$ layer can be made smaller than that of unstrained Ge within a range of proportions less than 4%. Thereby, a balance in mobility between electrons and holes can be controlled to make a balance in transconductance between complementary field effect transistors with each other. In the conventional complementary field effect transistors, the adjustment has been made only by changing the dimensions of the device. However, in the present method mentioned above provides an increase of the degree of freedom in design and is advantageous to an increase in degree of integration.

The way for strain control excepting the change in Ge composition ratio of $Si_{1-x}Ge_x$ may be to change the composition ratio y in $(Si_{1-x}Ge_x)_{1-y}C_y$ having the addition of C. A method of adding C may be the addition of C at the time of growth of a strain applying layer or the addition of C through ion implantation or the like after the growth of a strain applying layer.

The strain applying layer may be provided by a method of growing $Si_{1-x}Ge_x$ having a fixed composition or may be a so-called graded buffer layer formed by a method of increasing a composition ratio x gradually toward the direction of growth from an Si substrate. Also, a method of growing an Si layer with high defect density on an Si substrate at a low temperature or forming a defect layer on an Si substrate, for example, through the implantation of ions of hydrogen, Si, Ge or the like and thereafter growing $Si_{1-x}Ge_x$ is preferable since a threading dislocation density can be reduced as compared with the case where $Si_{1-x}Ge_x$ is directly grown on an Si substrate and since there results in a satisfactory surface flatness.

Also, when a portion including a substrate and a strain applying layer is provided with a so-called SOI (Silicon On Insulator) structure, a further enhancement in speed can be contemplated by virtue of the reduction of a stray capacity. A wafer-bonding type SOI substrate, an SIMOX (Separation by Implanted Oxygen) substrate and so forth are commercially available for SOI. An $Si_{1-x}Ge_x$ strain applying layer can be grown on such a substrate to manufacture a strained Si ($Si_{1-y}Ge_y$ (0<y≦1)) field effect transistor in which the best use of the feature of SOI is made.

Also, there can be used a method which includes the steps of first growing an $Si_{1-x}Ge_x$ strain applying layer on an Si substrate, thereafter performing the implantation of oxygen ions and a heat treatment to bury an $SiO_2$ insulating layer in the $Si_{1-x}Ge_x$ strain applying layer or in Si just therebelow and thereafter growing a strained Si layer or a method which includes the steps of first growing an $Si_{1-x}Ge_x$ strain applying layer and a strained Si layer on an Si substrate and thereafter performing the implantation of oxygen ions and a heat treatment to bury an $SiO_2$ insulating layer in the strained Si layer. With the use of these method, the thickness of the SOI active layer can be reduced, excellent device isolation is provided and no pMOS/nMOS well layer is required. Also, in the case of the latter method, since the $SiO_2$ insulating layer lies just below the strained Si layer, there is not generated the earlier-mentioned problem in pMOS that holes flow into the strain applying layer.

Alternatively, a substrate is prepared by growing an $Si_{1-x}Ge_x$ strain applying layer on an Si substrate, further growing an Si layer and thereafter subjecting a part or the whole of the Si layer to thermal oxidation. The thermal oxidation of the Si layer may be replaced by the growth of an $SiO_2$ layer on the $Si_{1-x}Ge_x$ strain applying layer through a vapor growth method or the like. The resultant structure and a separately prepared supporting substrate are bonded so that $SiO_2$ faces the supporting substrate. The $Si_{1-x}Ge_x$ strain applying layer is exposed by polishing the Si substrate having the $Si_{1-x}Ge_x$ strain applying layer grown thereon or performing the cutting through the implantation of hydrogen ions, the insertion of an intermediate porous Si layer, or the like. Thereby, the wafer-bonded SOI substrate with the $Si_{1-x}Ge_x$ strain applying layer can be manufactured. With this method, since it is possible to remove that portion of the $Si_{1-x}Ge_x$ strain applying layer which is near the Si substrate and has a high defect density, the reduction in defect density can be contemplated. Further, if the polishing, etching or the like is made, the insurance of a surface flatness is facilitated. With this method, the thickness of the SOI active layer can be reduced, excellent device isolation is provided and no pMOS/nMOS well layer is required.

In separating the bonded SOI substrate as mentioned above, it is not necessarily required that the $Si_{1-x}Ge_x$ strain applying layer is left. Namely, a substrate having a strained Si layer placed on an $SiO_2$ layer can be manufactured by growing an $Si_{1-x}Ge_x$ strain applying layer on an Si substrate, further growing a strained Si layer, subjecting a part of the strained Si layer to thermal oxidation, bonding the resultant substrate and a separately prepared supporting substrate so that $SiO_2$ faces the supporting substrate, and performing the polishing or the peeling off with the portion of the strained Si layer left. Apparently, this substrate is quite the same as the conventional laminated SOI substrate excepting that the SOI layer is applied with a strain. Accordingly, the present substrate can be handled in a manner quite similar to the conventional SOI substrate, is excellent in device isolation and requires no pMOS/nMOS well layer. And, the present substrate is provided with the feature of strained Si that by virtue of the effect of strain, the effective mass in the SOI active layer is light and the electron and hole mobilities therein are high. Also, since the $SiO_2$ insulating layer lies just below the strained Si layer, there is not generated the earlier-mentioned problem in pMOS that holes flow into the strain applying layer.

The thickness of the strained Si layer is subject to a fixed restriction. The reason is that an upper limit imposed on the thickness of a strained Si layer capable of growing without strain relaxation exists depending upon the magnitude of strain. This is called a critical thickness. Consider the case where a strained Si layer is grown on an $Si_{1-x}Ge_x$ strain applying layer. For example, when x=0.2, the magnitude of strain is about 0.8% and the critical thickness is about 100 nm. When x=0.5, the magnitude of strain is about 2% and the critical thickness is about 10 nm. However, the critical thickness depends upon the condition of growth of the strained Si layer and is not uniquely determinable. Also, in the case where an intermediate oxidation film layer is inserted as in the case where an SOI substrate and a strained Si layer are combined, there is a difference from the above restriction. However, it is preferable that in the range of about 0.2 to 0.8 for x providing a composition capable of realizing a practically significant strain or in the range of about 0.8 to 3.2% in terms of strain, the thickness of the strained Si layer falls within a range between 1 nm and 200 nm. The reason is that the thickness smaller than 1 nm is insufficient as the thickness of an active layer forming a channel of a field effect transistor. On the other hand, as the thickness becomes larger than 200 nm, a strain relaxation occurs so that a bad influence on electric characteristics begins to appear.

The selection of the surface orientation of a substrate crystal used and the transport direction of carriers in a channel related thereto is a matter required in the case where the operation at a higher speed is contemplated.

To use a {100} plane for the orientation of the substrate is advantageous in connection with the conventional device and the utilization of the same process as the conventional device since this orientation has hitherto been used in many Si semiconductor devices. Also, this orientation is preferable since the mobility is greatly increased when a strain is applied. In this case, the in-plane direction of the channel is selected to be a <110> or <001> direction. This is advantageous in enhancing the controllability of processes such as epitaxial growth and etching.

It is also possible to use a {110} plane as the substrate surface orientation. In this case, the selection of a <110> or <001> direction as the channel direction is advantageous in view of an increase in mobility caused by the application of a strain. Also, it is further preferable that the <110> direction is used as the channel for electrons. However, in the case where a balance between an nMOSFET and a pMOSFET is taken into consideration, it is not necessarily required that such an arrangement should be used.

As mentioned in the foregoing, a field effect transistor or complementary field effect transistors with a strain-applied active layer forming a channel and a semi-conductor device using such transistor(s) have a very high industrial value since the effective mass of carriers flowing through the channel is light as compared with the case of the conventional transistor(s) and semiconductor device, the mobility is therefore high, the enhancement in speed can be contemplated and the increase in degree of integration and the improvement in performance of the device can further be contemplated.

In the following, the present invention will be described in detail on the basis of embodiments thereof.

Embodiment 1

Figure 7:
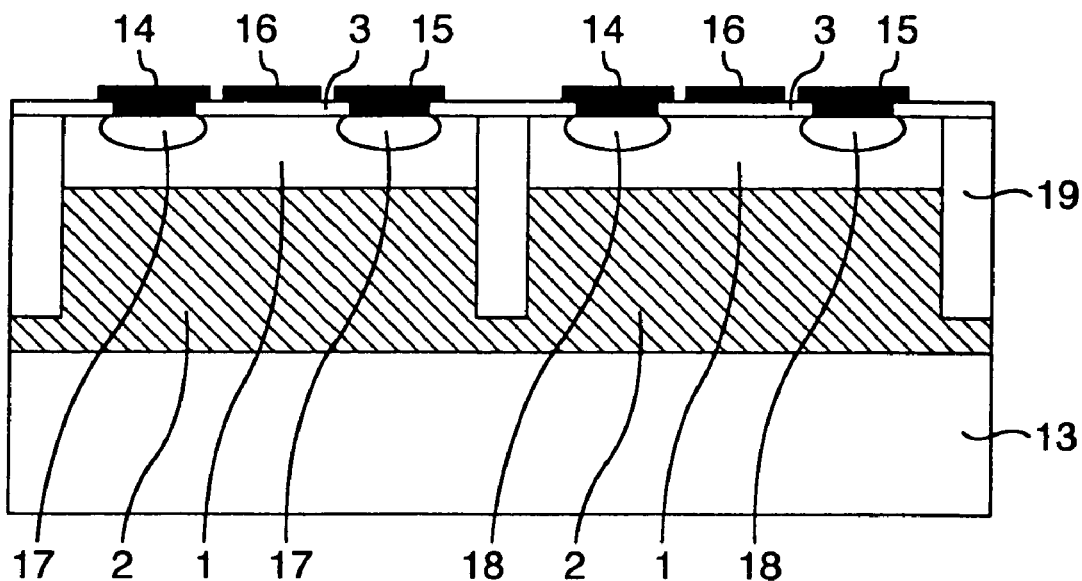
FIG. 7 is a cross section showing the structure of complementary field effect transistors according to Embodiment 1 of the present invention.

FIG. 7 is the cross section of CMOSFET's according to the present embodiment. After an Si substrate 13 is cleaned, it is immediately introduced into a chemical vapor growth chamber to grow an $Si_{0.7}Ge_{0.3}$ strain applying layer 2. The surface orientation of the Si substrate 13 is selected to be {100}. The thickness of the layer 2 is 500 nm. Source materials used include $Si_2H_6$ and $GeH_4$ and the layer is grown at a growing temperature of 700° C. Hereupon, no doping for determining the conduction type is conducted. The Ge composition ratio x of the $Si_{1-x}Ge_x$ strain applying layer 2 is arbitrarily controllable. However, x=0.2 to 0.4 provides a satisfactory result in order to optimize a strain to be applied to a strained Si layer 1.

Next, the strained Si layer 1 is formed on the $Si_{1-x}Ge_x$ strain applying layer 2 through a chemical vapor deposition. Hereupon, no doping for determining the conductivity type is conducted. The thickness is 60 nm. This layer is subjected to an in-plane tensile strain because the lattice constant of the $Si_{1-x}Ge_x$ strain applying layer 2 is larger than that of Si. This results in that the mobilities of carriers (electrons and holes) in the strained Si layer 1 are larger than those in unstrained Si. The growth of the Si layer and the SiGe layer is not limited to the chemical vapor deposition.

Next, a device isolation region 19 is formed through a trench isolation method and ion implantation for well formation is made over a lower portion of the strained Si layer 1 and the $Si_{1-x}Ge_x$ strain applying layer 2. The lower portion of a PMOS area is implanted with a V-group element such as P so that it has an n type, and the lower portion of an NMOS area is implanted with a III-group element such as B so that it has a p type. Further, an upper portion of the strained Si layer 1 is implanted with a III-group element in the PMOS area and a V-group element in the NMOS area to adjust a threshold voltage.

Next, the surface of the strained Si layer 1 is subjected to thermal oxidation to form an $SiO_2$ gate insulating film 3. Further, a polycrystalline silicon gate electrode 16 is formed on the film 3. Thereafter, the other than the gate region is etched away. Further, source/drain regions are formed in a self-alignment manner through an ion implantation method. At this time, p-type source/drain regions 17 can be formed by the implantation of a III-group element such as B and n-type source/drain regions 18 can be formed by the implantation of a V-group element such as P. Accordingly, it is possible to fabricate both the PMOS and the NMOS on the same wafer. In order to reduce a leakage current to the $Si_{1-x}Ge_x$ strain applying layer 2, the ion implantation depth is selected to be 30 nm which is equal to or smaller than the thickness of the strained Si layer 1. Finally, an inter-layer insulating film (not shown) is formed, contact holes are provided, and a metal film such as Al is vapor-deposited and patterned to form a metal wiring, thereby completing the field effect transistor. This transistor has a transconductance about 3 times as large as and a cut-off frequency 2.4 times as high as a field effect transistor of unstrained Si directly formed with the same dimension on an Si substrate.

Embodiment 2

Figure 8:
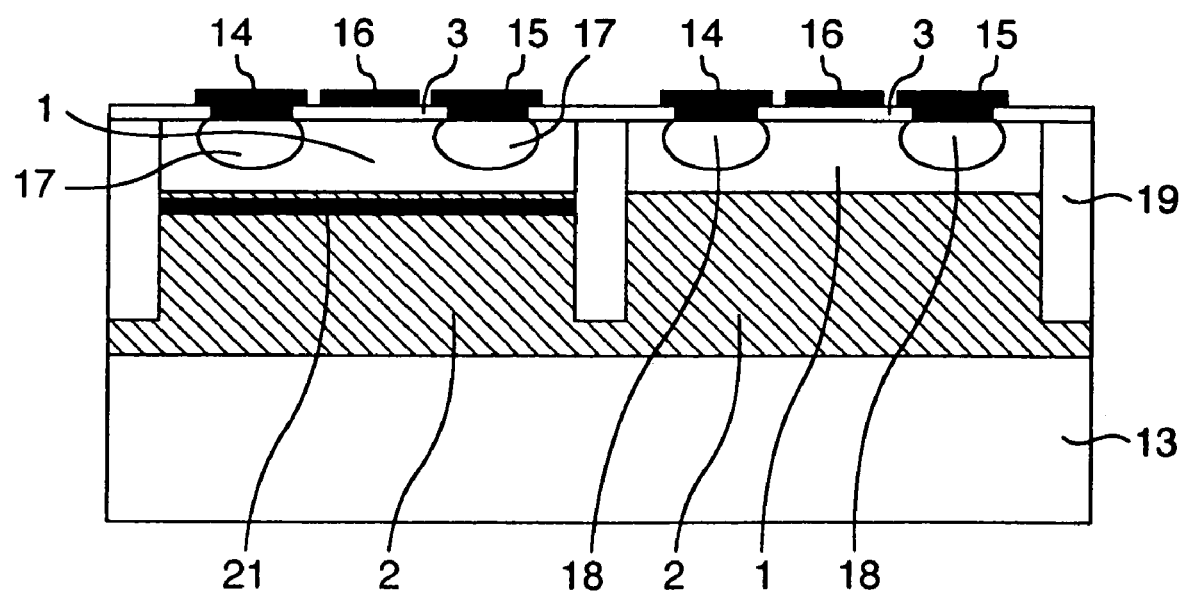
FIG. 8 is a cross section showing the structure of complementary field effect transistors according to Embodiment 2 of the present invention.

FIG. 8 is the cross section of CMOSFET's according to the present embodiment. In the present embodiment, the depth of the source/drain regions 17 and 18 is selected to be 50 nm which is deeper than 30 nm in Embodiment 1 and is used in the ordinary case. There-instead, at the time of formation of the $Si_{1-x}Ge_x$ strain applying layer 2, an upper depth portion of the layer 2 down to 30 nm is subjected to steep n-type doping at a high concentration of $10^{18}$ per cubic centimeter with a P doping gas mixed. In this case, the nMOS area is covered with an oxide film in order to subject only the pMOS area to the doping. The oxide film is removed after the doping is conducted.

However, the ion implantation for well formation is not made to the pMOS area subjected to the steep doping.

In the present embodiment too, the effects equivalent to those in Embodiment 1 are obtained with respect to the transconductance and the cut-off frequency.

Embodiment 3

Figure 9:
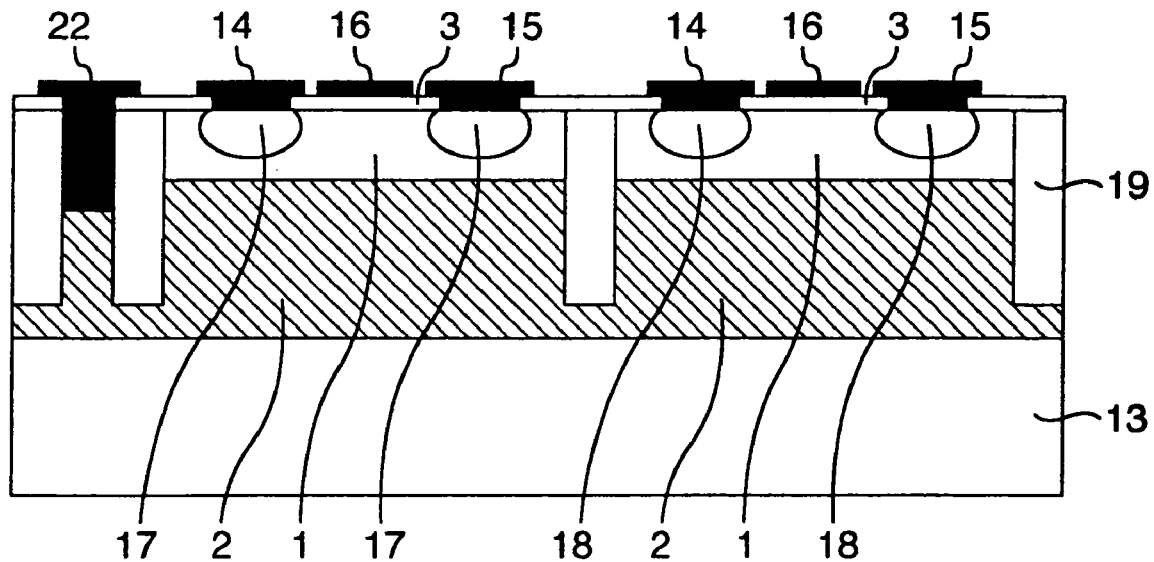
FIG. 9 is a cross section showing the structure of complementary field effect transistors according to Embodiment 3 of the present invention.

FIG. 9 is the cross section of CMOSFET's according to the present embodiment. In the present embodiment, the application of a positive bias to the pMOS well region is substituted for the steep doping in Embodiment 2.

More particularly, a contact hole is provided at the outside of a device area and an ohmic contact is formed thereat as a bias applying electrode 22.

By applying a voltage of +1V to the bias applying electrode 22, a punch through current can be reduced to 5% or less as compared with that in the case where no bias is applied.

The methods based on Embodiments 1 to 3 can be applied simultaneously and the combination of two or three thereof is possible.

Embodiment 4

Figure 10:
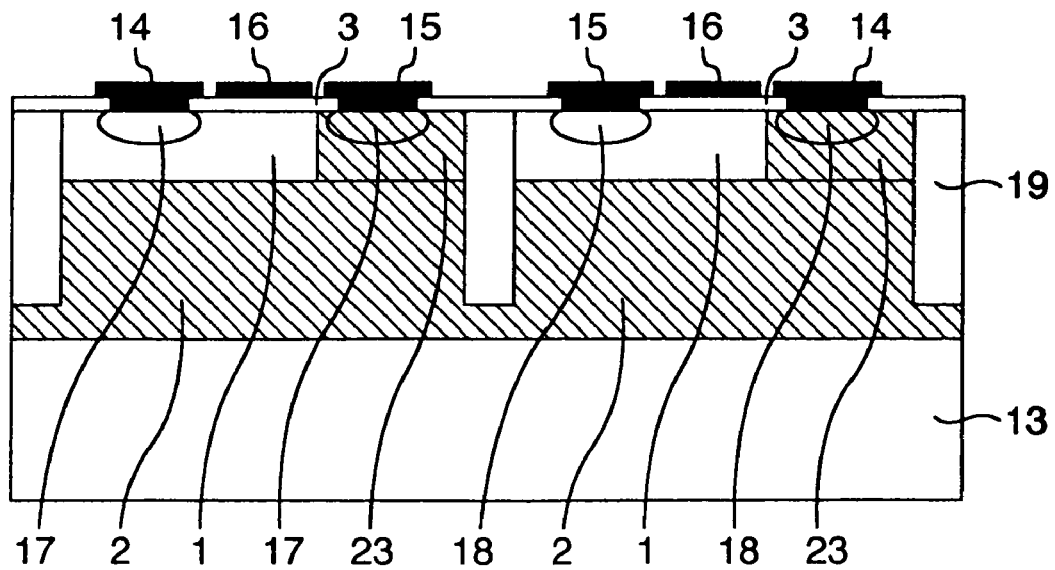
FIG. 10 is a cross section showing the structure of complementary field effect transistors according to Embodiment 4 of the present invention.

FIG. 10 is the cross section of CMOSFET's according to the present embodiment. In the present embodiment, a drain region 15 of the strained Si layer 1 in the p-type MOSFET and a source region 14 of the strained Si layer 1 in the n-type MOSFET in Embodiment 1 are selectively etched and the etched portions are filled up with $Si_{1-x}Ge_x$ layers 23 selectively grown therein. However, the surface layer of this portion with 5 nm is made of Si, thereby preventing the $Si_{1-x}Ge_x$ layer 23 from being damaged in the subsequent process.

The operating voltage of the transistor according to the present embodiment can be reduced as compared with the operating voltage of 3 V which are often used in conventional MOSFET'S.

Embodiment 5

Figure 11:
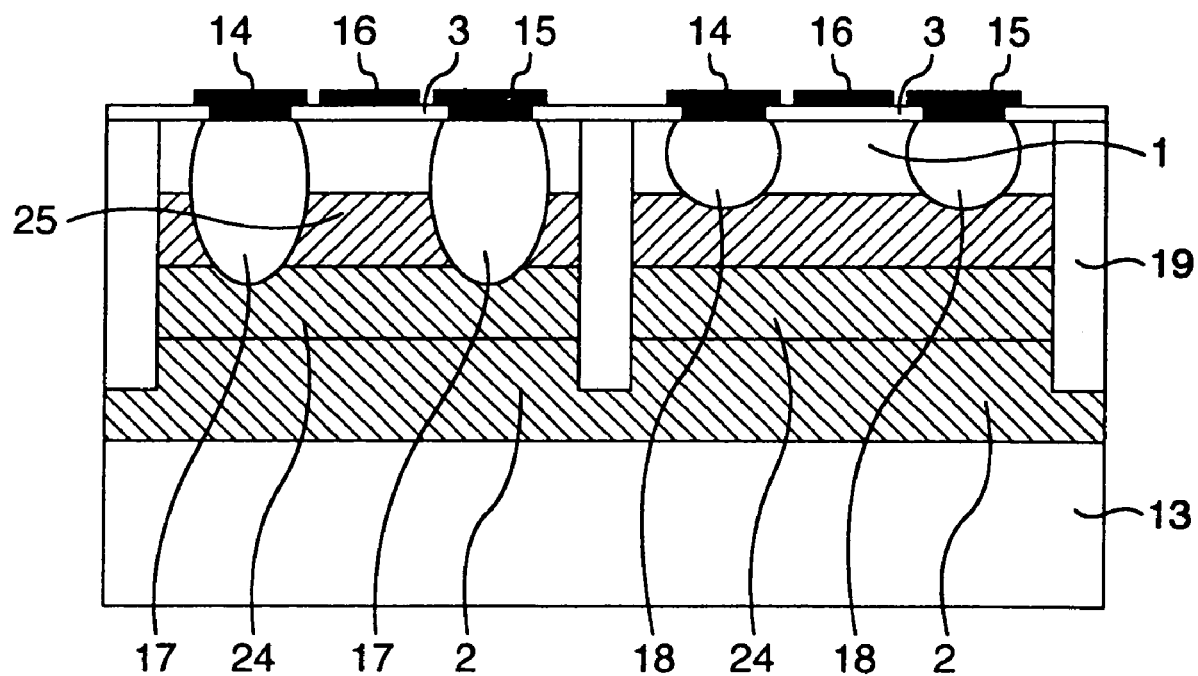
FIG. 11 is a cross section showing the structure of complementary field effect transistors according to Embodiment 5 of the present invention.

FIG. 11 is the cross section of CMOSFET's according to the present embodiment. The present embodiment is characterized in that a strained Gey layer is used as a channel for PMOS.

An Si substrate 13 is subjected to hydrogen ion implantation beforehand so that a layer with a high defect density is formed extending from the surface to the 100 nm depth. After this substrate is cleaned, it is immediately introduced into a chemical vapor deposition chamber to grow a lower strain applying layer 2 made of $Si_{1-x}Ge_x$ with x changed from 0.3 to 0.5 toward the growth direction. The thickness is 300 nm. Source materials used include $Si_2H_6$ and $GeH_4$ and the layer is grown at a growing temperature of 700° C.

Further, an upper strain applying layer 24 with 30 nm thickness made of $Si_{0.5}Ge_{0.5}$, a strained Ge layer 25 with 10 nm thickness, and a strained Si layer 1 with 13 nm thickness are similarly formed in the mentioned order so that they overlie each other. The growth of the Si, Ge and SiGe layers is not limited to the chemical vapor deposition method. Any method capable of crystal growth having the above composition may be used. The strained Ge layer 25 is subjected to an in-plane compressive strain and the strained Si layer 1 is subjected to an in-plane tensile strain. Thereby, both holes in the strained Ge layer 25 and electrons in the strained Si layer 1 have effective masses reduced as compared with those in ordinary Si so that the mobilities thereof are increased.

Next, there are performed, in a manner similar to that in Embodiment 1, the formation of a device isolation region 19, the ion implantation for well formation over the $Si_{0.5}Ge_{0.5}$ layer 24 as the upper strain applying layer and the $Si_{1-x}Ge_x$ layer 2 as the lower strain applying layer, and the low-concentration ion implantation for threshold value adjustment to an upper portion of the strained Si layer 1 and an upper portion of the strained Ge layer 25. Subsequently, the formation of an $SiO_2$ gate insulating film 3, the formation of a gate electrode 16 and the formation of source/drain regions 17 and 18 are performed. The ion implantation depth of the source/drain regions 17 and 18 is selected such that the depth for nMOS is 10 nm which is on the same order as the thickness of the strained Si layer 1 and the depth for PMOS is 20 nm which reaches the strained Ge layer 25. Finally, the formation of an inter-layer insulating film, the provision of contact holes and the formation of a metal wiring are performed, thereby completing the CMOSFET's.

In the present embodiment, the $Si_{0.5}Ge_{0.5}$ layer 24 with x=0.5 is grown as the upper strain applying layer. Therefore, strain application quantities applied to the strained Si layer 1 and the strained Ge layer 25 are large.

In the present embodiment, the strained Gey layer is used for the channel. However, a strained $Si_{1-y}Ge_y$ layer (0<y<1) with the mixture of Si may be used. In this case, the composition ratio y is selected to be larger than the composition ration x of the $Si_{1-x}Ge_x$ strain applying layer.

Embodiment 6

Figure 12:
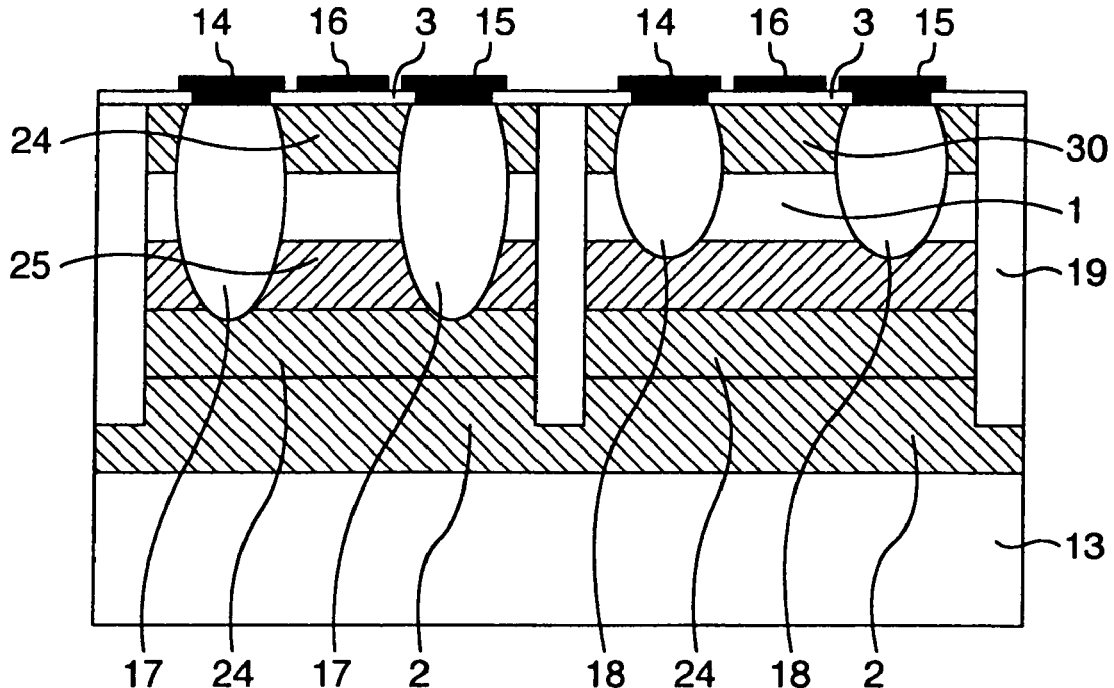
FIG. 12 is a cross section showing the structure of complementary field effect transistors according to Embodiment 6 of the present invention.

FIG. 12 is the cross section of CMOSFET's according to the present embodiment. In the present embodiment, an $Si_{0.5}Ge_{0.5}$ barrier layer 30 with 2 nm is formed on the strained Si layer 1 in Embodiment 5.

Since the $Si_{0.5}Ge_{0.5}$ barrier layer 30 is thus provided between the strained Si layer 1 and the gate insulating film 3, electrons are not scattered at the interface between the strained Si layer 1 and the gate insulating film 3 or they are stored in the strained Si layer 1 in the vicinity of the interface between the $Si_{0.5}Ge_{0.5}$ barrier layer 30 and the strained Si layer 1.

In the present embodiment, the strained Si layer 1 is formed as an overlying layer on the strained Ge layer 25. However, this overlying sequence may be reversed. The ion implantation depth of the source/drain regions 17 and 18 is selected such that the depth for nMOS is 12 nm which is on the same order as the thickness of the strained Si layer 1 and the depth for pMOS is 22 nm which reaches the strained Ge layer 25.

Embodiment 7

Figure 13:
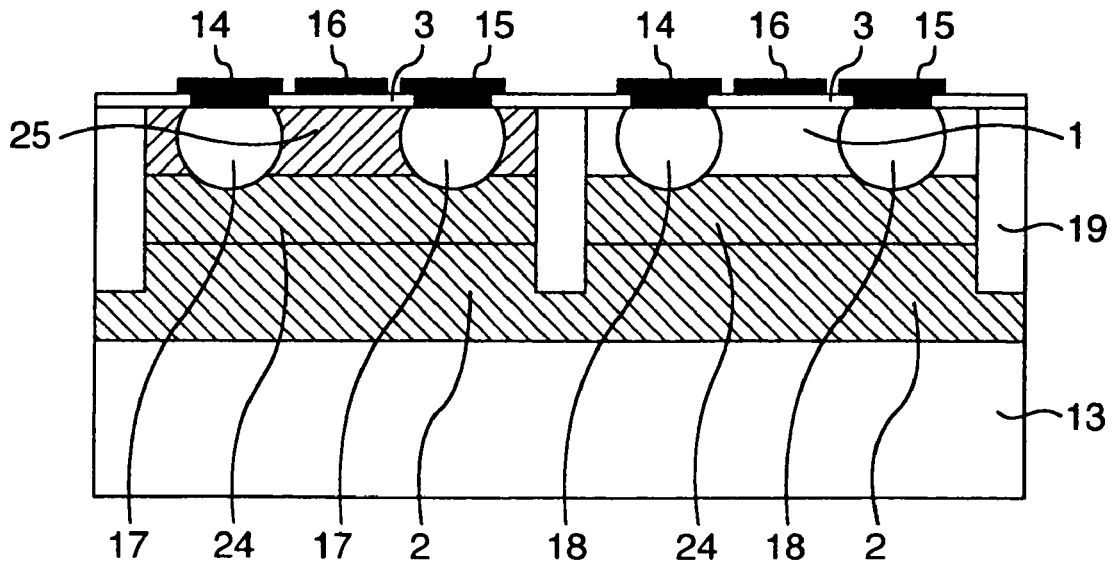
FIG. 13 is a cross section showing the structure of complementary field effect transistors according to Embodiment 7 of the present invention.

FIG. 13 is the cross section of CMOSFET's according to the present embodiment. In the present embodiment, the overlying arrangement of the strained Si layer 1 and the strained Ge layer 25 in Embodiment 5 is replaced by the juxtaposition or parallel arrangement.

More particularly, it is a strained Ge layer 25 with 10 nm for the PMOS area and a strained Si layer 1 with 12 nm for the nMOS area which are selectively grown on the $Si_{0.5}Ge_{0.5}$ strain applying layer 24. The strained Ge layer 25 is subjected to an in-plane compressive strain and the strained Si layer 1 is subjected to an in-plane tensile strain. Thereby, both holes in the strained Ge layer 25 and electrons in the strained Si layer 1 have effective masses reduced as compared with those in ordinary Si so that the mobilities thereof are increased.

Embodiment 8

Figure 14:
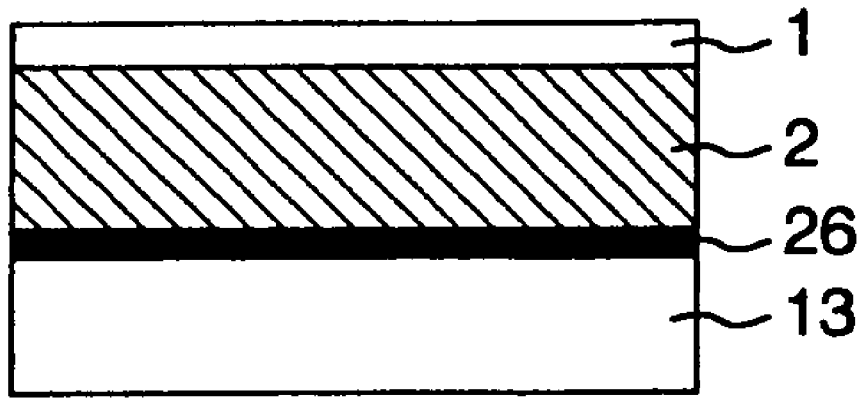
FIG. 14 is the cross section of an SOI substrate according to Embodiment 8 of the present invention.

FIG. 14 is the cross section of an SOI substrate according to the present embodiment. After an Si substrate 13 having an epitaxial layer 100 nm thick with high defect density formed on a surface thereof is cleaned, the Si substrate 13 is immediately introduced into a chemical vapor deposition chamber to grow an $Si_{1-x}Ge_x$ strain applying layer 2. The thickness is 150 nm. Source materials used include $Si_2H_6$ and $GeH_4$ and the layer is grown at a temperature of 700° C. The Ge composition ratio x of the $Si_{1-x}Ge_x$ strain applying layer 2 is arbitrarily controllable. However, x=0.2 to 0.4 provides a satisfactory result in order to optimize a strain to be applied to a strained Si layer 1 which will be formed later on. In the present embodiment, x is selected to be 0.3. The growth of the Si and SiGe layers is not limited to the chemical vapor deposition. Any method capable of crystal growth having the above composition may be used.

Next, oxygen ions are implanted from the upper side of the $Si_{1-x}Ge_x$ strain applying layer 2 under the conditions of the accelerating voltage of 180 KeV and the dosage of $4\times10^{17}/cm^2$ and the annealing is performed for 8 hours at 1350° C. Thereby, an $SiO_2$ insulating layer 26 is formed just below the $Si_{1-x}Ge_x$ strain applying layer 2. The thickness of the $SiO_2$ insulating layer 26 is about 100 nm so that a breakdown voltage equal to or higher than 50 V is ensured. With the annealing treatment, the $Si_{1-x}Ge_x$ strain applying layer 2 can have a very low defect density, a flatness and a sufficient strain relaxation. Further, a strained Si layer 1 with 60 nm thickness is formed on the layer 2 through a chemical vapor deposition.

Thereafter, a process similar to that in Embodiment 1 of the present invention or the like can be used to manufacture CMOSFET's. The use of the present substrate makes the ion implantation into well layers unnecessary.

Also, since a stray capacity is greatly reduced, the operating speed of the circuit containing the present CMOSFETs can be enhanced by about 40% as compared with that when an ordinary Si substrate is used.

Embodiment 9

Figure 15:
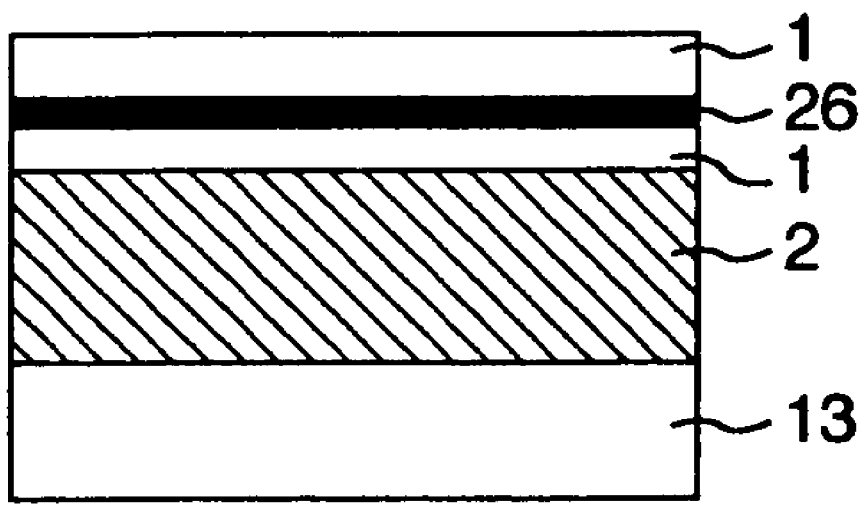
FIG. 15 is the cross section of an SOI substrate according to Embodiment 9 of the present invention.

FIG. 15 is the cross section of another embodiment of the SOI substrate. In a manner similar to that in Embodiment 8, an $Si_{1-x}Ge_x$ strain applying layer 2 is formed. Thereafter, a strained Si layer 1 with 120 nm thickness is formed on the $Si_{1-x}Ge_x$ strain applying layer 2 through a chemical vapor deposition method. Next, oxygen ions are implanted from the upper side of the strained Si layer 1 under the conditions of the accelerating voltage of 50 KeV and the dosage of $2\times10^{17}/cm^2$ and the annealing is performed for 8 hours at 1300° C. Thereby, an $SiO_2$ insulating layer 26 is formed into the strained Si layer 1. The thickness of the $SiO_2$ insulating layer 26 is about 30 nm.

In the present embodiment, the ion implantation into well layers becomes unnecessary. In addition, the effluence of holes into the SiGe strain applying layer in pMOS is hard to happen. Therefore, it is not necessary to use that special measure for prevention of the effluence of holes which is based on the doping, the application of a bias, or the like.

Embodiment 10

Figure 16A:
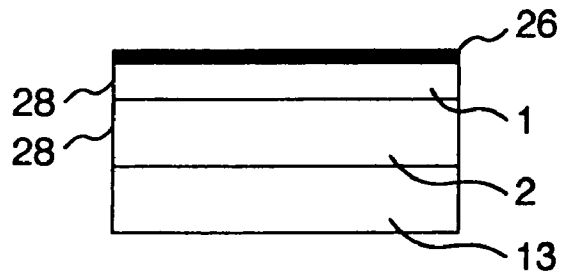
FIGS. 16a to 16d are cross sections showing the manufacture steps of an SOI substrate according to Embodiment 10 of the present invention.

FIGS. 16a to 16d are cross sections showing the manufacture steps of an SOI substrate according to the present embodiment. First, a Si substrate 13 having an epitaxial layer 100 nm thick with high defect density formed on a surface thereof is introduced into a chemical vapor deposition chamber immediately after the cleaning thereof so that an $Si_{1-x}Ge_x$ strain applying layer 2 is grown, as shown in FIG. 16a. The thickness is 300 nm. Source materials used include $Si_2H_6$ and $GeH_4$ and the layer is grown at a growing temperature of 700° C. The Ge composition ratio x of the $Si_{1-x}Ge_x$ strain applying layer 2 is arbitrarily controllable. However, x=0.2 to 0.4 provides a satisfactory result in order to optimize a strain to be applied to a strained Si layer 1. In the present embodiment, x is selected to be 0.3. The growth of the Si and SiGe layers is not limited to the chemical vapor deposition method. Any method capable of crystal growth having the above composition may be used. Also, a Ge substrate or an SiGe mixed crystal substrate may be used in place of the Si substrate 13. In the case where the Ge compositional ratio is large, the use of a Ge substrate or an SiGe substrate having a larger Ge content facilitates the growth of the $Si_{1-x}Ge_x$ strain applying layer 2 or makes it unnecessary.

Next, the strained Si layer 1 is grown and the surface is subjected to thermal oxidation. Then, hydrogen ions are implanted down to the depth of a cutting position 28 so that a defective layer is formed at this position. Thus, there results in a state shown in FIG. 16a. The separating position 28 may lie in either the $Si_{1-x}Ge_x$ strain applying layer 2 or the strained Si layer 1.

Figure 16B:
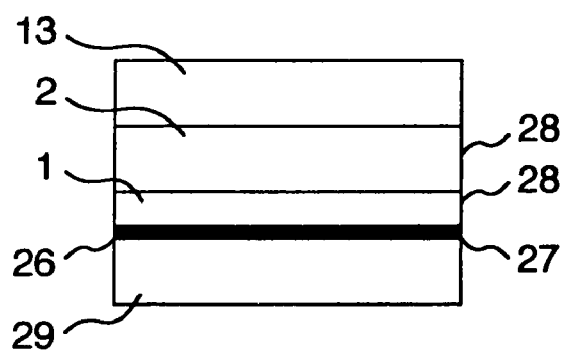
Figure 16C:
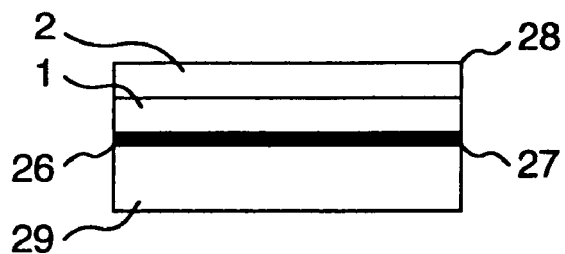
Figure 16D:
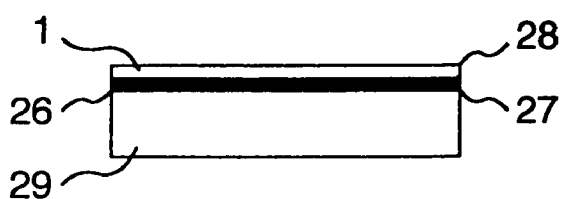

Further, the surface oxide film and a separately prepared supporting substrate 29 are bonded to each other at a bonding position 27, thereby resulting in a state shown in FIG. 16b. Then, the annealing is made at 500° C., thereby causing the separation at the separating position 28. In the case where the separating position 28 lies in the $Si_{1-x}Ge_x$ strain applying layer 2, there results in a state as shown in FIG. 16c. In the case where the separating position 28 lies in the strained Si layer 1, there results in a state as shown in FIG. 16d. In the case shown in FIG. 16c, an additional strained Si layer 1 with 60 nm is epitaxially grown on the surface.

Thereafter, a process similar to that in Embodiment 1 of the present invention or the like can be used to manufacture CMOSFET's. The use of the present substrate makes the ion implantation into well layers unnecessary. Further, in the case of the structure shown in FIG. 16d, the effluence of holes into the SiGe strain applying layer in pMOS does not occur. Therefore, it becomes unnecessary to use that measure for prevention of the effluence of holes which is based on the doping, the application of a bias, or the like.

Also, since a stray capacity is greatly reduced, the operating speed of the circuit containing the present CMOSFETs can be enhanced by about 40% as compared with that when an ordinary Si substrate is used.

Embodiment 11

By the method shown in Embodiment 1, complementary field effect transistors are fabricated with the {100} plane Si substrate 13 used and the Ge composition ratio x of the $Si_{1-x}Ge_x$ strain applying layer 2 variously changed. The electron and hole mobilities along the <001> direction in the strained Si channel are estimated from the transconductance of the device. As shown in Table 1, an increase in mobility is considerably large even if the Ge compositional ratio is as low as 0.2. The unit is % for strain (positive value for tensile strain) and $cm^2/Vs$ for mobility.

TABLE 1

| Ge COMPOSITION RATIO x | STRAIN | ELECTRON MOBILITY | HOLE MOBILITY |
| --- | --- | --- | --- |
| 0 | 0 | 1300 | 400 |
| 0.1 | 0.4 | 2600 | 850 |
| 0.2 | 0.8 | 3300 | 2000 |
| 0.3 | 1.2 | 3550 | 3100 |
| 0.4 | 1.6 | 3500 | 4500 |
| 0.5 | 2.0 | 3450 | 5200 |
| 0.6 | 2.4 | 3400 | 6100 |

By the method shown in Embodiment 7, pMOSFET's are fabricated with the {100} plane Si substrate 13 used and the Ge composition ratio x of the $Si_{1-x}Ge_x$ strain applying layer 2 variously changed. The hole mobility along the <001> direction in the strained Ge channel is estimated from the transconductance of the devices. As shown in Table 2, the mobility makes a rapid increase as there is subjected to the in-plane compressive strain. The unit is % for strain (positive value for tensile strain) and cm$^2$/Vs for mobility.

TABLE 2

| Ge COMPOSITION RATIO x | STRAIN | HOLE MOBILITY |
| --- | --- | --- |
| 1.0 | 0 | 1900 |
| 0.9 | −0.4 | 2800 |
| 0.8 | −0.8 | 4100 |
| 0.7 | −1.2 | 7000 |
| 0.6 | −1.6 | 9000 |
| 0.5 | −2.0 | 12000 |
| 0.4 | −2.4 | 13500 |

By the method shown in Embodiment 1, complementary field effect transistors are fabricated with the {110} plane Si substrate 13 used. The electron and hole mobilities along the <001> direction and the <110> direction in the strained Si channel are estimated from the transconductance of the devices. As shown in Table 3, the electron mobility in the <110> direction is larger than that in the <001> direction. The unit is % for strain (positive value for tensile strain) and cm$^2$/Vs for mobility.

TABLE 3

| Ge COMPOSITION RATIO x | STRAIN | ORIENTATION | ELECTRON MOBILITY | HOLE MOBILITY |
| --- | --- | --- | --- | --- |
| 0.2 | 0.8 | <001> | 900 | 1800 |
| 0.2 | 0.8 | <110> | 3100 | 1800 |
| 0.3 | 1.2 | <001> | 900 | 2700 |
| 0.3 | 1.2 | <110> | 3300 | 2700 |

According to the embodiments of the present invention mentioned above, it is possible to realize complementary field effect transistors which have a high speed and a low power consumption and a semiconductor device in which such transistors are incorporated.

The invention claimed is:

1. A method of manufacturing a semiconductor device having p-MOS and n-MOS transistors, the method comprising:
   (a) forming a $Si_{1-x}Ge_x$ strain applying layer, which is substantially strain relaxed and has an in-plane lattice constant larger than that of unstrained Si within a range of proportions greater than 0% and less than 4% on a semiconductor substrate, where 0<x<1;
   (b) growing a strained Si layer on said $Si_{1-x}Ge_x$ strain applying layer, thereby forming said strained Si layer which is subjected to in-plane tensile strain;
   (c) forming a $SiO_2$ layer on a surface of said strained Si layer;
   (d) bonding said $SiO_2$ layer and a supporting substrate to each other;
   (e) removing said semiconductor substrate, said $Si_{1-x}Ge_x$ strain applying layer and a part of said strained Si layer, thereby forming an SOI substrate composed of a stack of said supporting substrate, said SiO layer and said strained Si layer; and
   (f) forming said p-MOS and n-MOS transistor on a surface of said strained Si layer.

2. A method of manufacturing a semiconductor device according to claim 1, wherein an in-plane lattice constant of said strained Si layer is larger than that of unstrained Si within a range of proportions greater than 0% and less than 4%.

3. A method of manufacturing a semiconductor device according to claim 1, wherein the surface orientation of each of said $Si_{1-x}Ge_x$ strain applying layer and said strained Si layer is {110}.

4. A method of manufacturing a semiconductor device according to claim 1, wherein channel region of said p-MOS and n-MOS transistors are formed where an in-plane lattice constant of said strained Si layer is larger than that of unstrained Si within a range of proportions greater than 0% and less than 4%.

5. A method of manufacturing a semiconductor device according to claim 1, wherein the surface orientation of each of said $Si_{1-x}Ge_x$ strain applying layer and said strained Si layer is {100}.

6. A method of manufacturing a semiconductor device according to claim 1, wherein the surface orientation of each of said $Si_{1-x}Ge_x$ strain applying layer and said strained Si layer is {110}.

7. A method of manufacturing a semiconductor device according to claim 1, wherein, in the step of (c), subjecting a surface of said strained Si layer to thermal oxidation.

* * * * *